US012578642B2

(12) United States Patent
Park et al.

(10) Patent No.: US 12,578,642 B2
(45) Date of Patent: Mar. 17, 2026

(54) PHOTOSENSITIVE RESIN COMPOSITION, AND PHOTOSENSITIVE RESIN FILM AND COLOUR FILTER MANUFACTURED BY USING SAME

(71) Applicant: SAMSUNG SDI CO., LTD., Yongin-si (KR)

(72) Inventors: Kyoungsoo Park, Suwon-si (KR); Sunghoon Park, Suwon-si (KR); Se Il Oh, Suwon-si (KR); Youngmin Jeon, Suwon-si (KR); Juho Jung, Suwon-si (KR); Seyoung Choi, Suwon-si (KR); Han Chul Hwang, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 854 days.

(21) Appl. No.: 17/796,007

(22) PCT Filed: Jul. 13, 2021

(86) PCT No.: PCT/KR2021/008933
§ 371 (c)(1),
(2) Date: Jul. 28, 2022

(87) PCT Pub. No.: WO2022/055109
PCT Pub. Date: Mar. 17, 2022

(65) Prior Publication Data

US 2023/0101261 A1 Mar. 30, 2023

(30) Foreign Application Priority Data

Sep. 8, 2020 (KR) ........................ 10-2020-0114722

(51) Int. Cl.
*G03F 7/105* (2006.01)
*C08K 5/435* (2006.01)
*G03F 7/00* (2006.01)
*G03F 7/004* (2006.01)
*G03F 7/033* (2006.01)

(52) U.S. Cl.
CPC .............. *G03F 7/105* (2013.01); *C08K 5/435* (2013.01); *G03F 7/0007* (2013.01); *G03F 7/0045* (2013.01); *G03F 7/033* (2013.01)

(58) Field of Classification Search
CPC .......... G03F 7/0007; C08K 5/36; C08K 5/435
See application file for complete search history.

(56) References Cited

U.S. PATENT DOCUMENTS

| | | | |
|---|---|---|---|
| 2008/0206658 A1 | 8/2008 | Hall-Goulle et al. |
| 2014/0027683 A1 | 1/2014 | Sasaki |
| 2014/0175344 A1 | 6/2014 | Ryu et al. |
| 2016/0355684 A1 | 12/2016 | Li et al. |

FOREIGN PATENT DOCUMENTS

| | | | | | |
|---|---|---|---|---|---|
| CN | 102298263 A | | 12/2011 | |
| CN | 104583870 A | | 4/2015 | |
| CN | 107037689 A | | 8/2017 | |
| CN | 109870878 A | * | 6/2019 | ............. G03F 7/105 |
| JP | 2008-511706 A | | 4/2008 | |
| JP | 5103986 B2 | | 12/2012 | |
| JP | 2016-172861 A | | 9/2016 | |
| JP | 2017-053978 A | | 3/2017 | |
| JP | 6172323 B2 | | 8/2017 | |
| JP | 2018-059097 A | | 4/2018 | |
| JP | 2020-012921 A | | 1/2020 | |
| KR | 10-2005-0077348 A | | 8/2005 | |
| KR | 10-2008-0043154 A | | 5/2008 | |
| KR | 10-2010-0031618 A | | 3/2010 | |
| KR | 10-1333695 B1 | | 11/2013 | |
| KR | 10-2013-0137537 A | | 12/2013 | |
| KR | 10-2015-0036548 A | | 4/2015 | |
| KR | 10-2016-0066221 A | | 6/2016 | |
| KR | 10-2016-0119781 A | | 10/2016 | |
| KR | 10-2018-0010040 A | | 1/2018 | |
| KR | 10-2018-0020321 A | | 2/2018 | |
| KR | 20180048067 A | * | 5/2018 | ............. G03F 7/004 |
| KR | 20190048321 A | * | 5/2019 | ............... C09B 1/16 |
| KR | 10-2019-0063974 A | | 6/2019 | |
| KR | 10-2045330 B1 | | 11/2019 | |
| TW | 202022496 A | | 6/2020 | |
| WO | WO 2016/042171 A2 | | 3/2016 | |
| WO | WO 2020/138124 A1 | | 7/2020 | |

OTHER PUBLICATIONS

Machine translation of JP 2017-053978 (No. date) (Year: 0000).*
International Search Report dated Oct. 19, 2021 for PCT/KR2021/008933.
Korean Notice of Allowance dated Apr. 2, 2024.
Chinese Office action dated Jan. 9, 2025.

* cited by examiner

*Primary Examiner* — Amanda C. Walke
(74) *Attorney, Agent, or Firm* — Lee IP Law, P.C.

(57) ABSTRACT

Disclosed are a photosensitive resin composition including (A) a colorant including a xanthene-based dye and a blue pigment having an average particle diameter (D50) of less than 100 nm; (B) a binder resin including a radically polymerizable double bond; (C) a photopolymerizable compound; (D) a photopolymerization initiator; (E) a matting agent; and (F) a solvent, a photosensitive resin layer manufactured using the photosensitive resin composition, and a color filter including the photosensitive resin layer.

16 Claims, No Drawings

PHOTOSENSITIVE RESIN COMPOSITION, AND PHOTOSENSITIVE RESIN FILM AND COLOUR FILTER MANUFACTURED BY USING SAME

CROSS REFERENCE TO RELATED APPLICATIONS

This is the U.S. national phase application based on PCT Application No. PCT/KR2021/008933, filed Jul. 13, 2021, which is based on Korean Patent Application No. 10-2020-0114722, filed Sep. 8, 2020, the entire contents of all of which are hereby incorporated by reference.

TECHNICAL FIELD

This disclosure relates to a photosensitive resin composition, a photosensitive resin layer manufactured using the same, and a color filter including the photosensitive resin layer.

BACKGROUND ART

A liquid crystal display device among many types of displays has an advantage of lightness, thinness, low cost, low power consumption for operation, and improved adherence to an integrated circuit and has been more widely used for a laptop computer, a monitor, and a TV screen.

The liquid crystal display device includes a lower substrate on which a black matrix, a color filter, and an ITO pixel electrode are formed, and an upper substrate on which an active circuit portion including a liquid crystal layer, a thin film transistor, and a capacitor layer and an ITO pixel electrode are formed. Color filters are formed in a pixel region by sequentially stacking a plurality of color filters (in general, formed of a plurality of colors (generally three primary colors of red (R), green (G), and blue (B)) in a predetermined order to form each pixel, and a black matrix layer is disposed in a predetermined pattern on a transparent substrate to form a boundary between the pixels.

The pigment dispersion method that is one of methods of forming a color filter provides a colored thin film by repeating a series of processes such as coating a photopolymerizable composition including a colorant on a transparent substrate including a black matrix, exposing a formed pattern to light, removing a non-exposed part with a solvent, and thermally curing the same.

A coloring photosensitive resin composition used for manufacturing a color filter according to the pigment dispersion method generally includes an alkali soluble resin, a photopolymerization monomer, a photopolymerization initiator, a solvent, and other additives and may further include an epoxy resin. The pigment dispersion method having such characteristics is actively applied to manufacture an LCD of a mobile phone, a laptop, a monitor, and TV.

However, the photosensitive resin composition for a color filter using the pigment dispersion method having many merits has some drawbacks, since there are difficulties in minutely pulverizing of a powder, requiring various additives for stabilizing a dispersion even if dispersed and complex processes, and further maintaining optimal quality of a pigment dispersion under complicated storage and transportation conditions.

In addition, a color filter manufactured by using a pigment-type photosensitive resin composition has a limit in luminance and a contrast ratio due to a pigment particle size.

Accordingly, efforts to develop a dye having heat and chemical resistance similar to that of a pigment, instead of the pigment and a photosensitive resin composition using the dye as a colorant are continuing.

DISCLOSURE

Technical Problem

An embodiment provides a photosensitive resin composition having improved color characteristics such as brightness and contrast ratio, and improved dissolution resistance without color migration.

Another embodiment provides a photosensitive resin layer manufactured using the photosensitive resin composition.

Another embodiment provides a color filter including the photosensitive resin layer.

Technical Solution

An embodiment provides a photosensitive resin composition including (A) a colorant including a xanthene-based dye and a blue pigment having an average particle diameter (D50) of less than 100 nm; (B) a binder resin including a radically polymerizable double bond; (C) a photopolymerizable compound; (D) a photoinitiator; (E) a matting agent represented by Chemical Formula 1; and (F) a solvent.

[Chemical Formula 1]

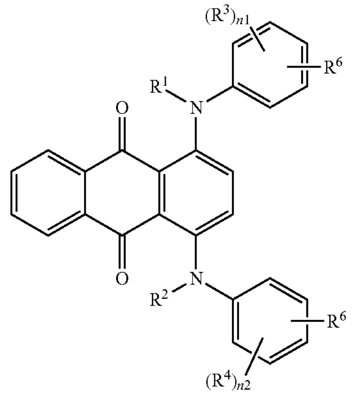

In Chemical Formula 1, $R^1$ to $R^4$ are each independently a hydrogen atom, a substituted or unsubstituted C1 to C20 alkyl group or a substituted or unsubstituted C6 to C20 aryl group, $R^5$ and $R^6$ are each independently a hydrogen atom, a substituted or unsubstituted C1 to C20 alkyl group, or a substituted or unsubstituted sulfonamide group, provided that at least one of $R^5$ and $R^6$ is a substituted or unsubstituted sulfonamide group, and n1 and n2 are each independently an integer of 1 to 3.

The substituted or unsubstituted sulfonamide group may be represented by Chemical Formula 2.

[Chemical Formula 2]

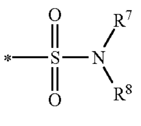

In Chemical Formula 2, $R^7$ and $R^8$ are each independently a hydrogen atom, a substituted or unsubstituted C1 to C20 alkyl group, a substituted or unsubstituted C3 to C20 cycloalkyl group, or a substituted or unsubstituted C6 to C20 aryl group.

The matting agent represented by Chemical Formula 1 may have a symmetrical structure.

The matting agent represented by Chemical Formula 1 may have a weight average molecular weight of greater than or equal to 540 g/mol.

The xanthene-based dye may be represented by Chemical Formula 3.

[Chemical Formula 3]

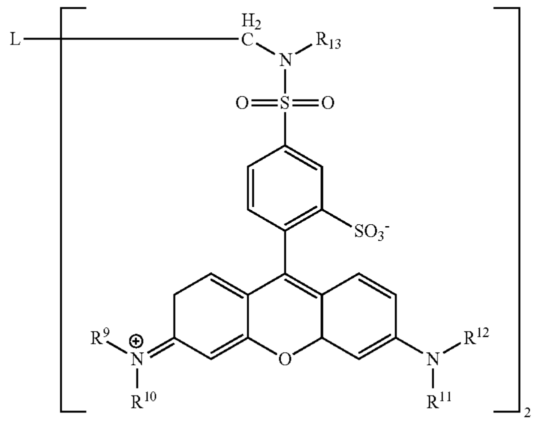

In Chemical Formula 3, $R^9$ to $R^{13}$ are each independently a hydrogen atom, a substituted or unsubstituted C1 to C20 alkyl group or a substituted or unsubstituted C6 to C20 aryl group, and L is a divalent linking group containing at least one aromatic ring.

In Chemical Formula 3, L may be a substituted or unsubstituted C6 to C20 arylene group.

The xanthene-based dye may be included in a less amount than that of the blue pigment.

The blue pigment may be included in the photosensitive resin composition in the form of dispersion, the dispersion may further include a dispersion resin, and the dispersion resin may have a weight average molecular weight of 5000 g/mol to 10000 g/mol, and an acid value of 80 KOHmg/g to 150 KOHmg/g.

The binder resin may include a structural unit represented by Chemical Formula 4-1.

[Chemical Formula 4-1]

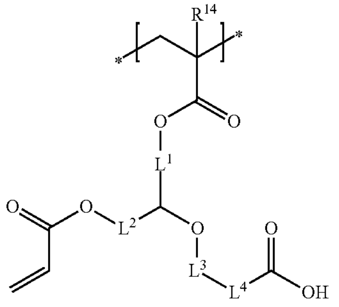

In Chemical Formula 4-1, $R^{14}$ is a hydrogen atom or a substituted or unsubstituted C1 to C20 alkyl group, $L^1$ to $L^3$ are each independently a single bond or a substituted or unsubstituted C1 to C20 alkylene group, and $L^4$ is a divalent linking group including a carbon-carbon double bond.

The binder resin may further include a structural unit represented by Chemical Formula 4-2, a structural unit represented by Chemical Formula 4-3, or a combination thereof.

[Chemical Formula 4-2]

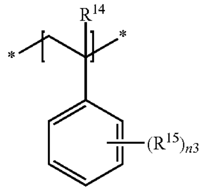

[Chemical Formula 4-3]

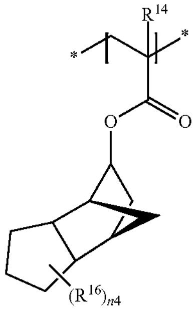

In Chemical Formula 4-2 and Chemical Formula 4-3, $R^{14}$ is a hydrogen atom or a substituted or unsubstituted C1 to C20 alkyl group, $R^{15}$ and $R^{16}$ are each independently a substituted or unsubstituted C1 to C20 alkyl group or a substituted or unsubstituted C6 to C20 aryl group, n3 is an integer of 0 to 5, and n4 is an integer of 0 to 3.

The binder resin may have a double bond equivalent of 300 g/mol to 700 g/mol.

The binder resin may have a weight average molecular weight of 5000 g/mol to 20000 g/mol.

The binder resin may have an acid value of 20 KOHmg/g to 90 KOHmg/g.

The photosensitive resin composition may include 20 wt % to 40 wt % of the (A) colorant; 0.5 wt % to 20 wt % of the (B) binder resin; 1 wt % to 20 wt % of the (C) photopolymerizable compound; 0.1 wt % to 5 wt % of the (D) photopolymerization initiator; 0.01 wt % to 1 wt % of the (E) matting agent; and a balance amount of the (F) solvent, based on the total amount of the photosensitive resin composition.

The photosensitive resin composition may further include at least one additive selected from malonic acid; 3-amino-1,2-propanediol; a coupling agent containing a vinyl group or a (meth)acryloxy group; a leveling agent; and a fluorine-based surfactant.

Another embodiment provides a photosensitive resin layer manufactured using the photosensitive resin composition.

Another embodiment provides a color filter including the photosensitive resin layer.

Other embodiments of the present invention are included in the following detailed description.

Advantageous Effects

The photosensitive resin composition according to an embodiment may provide a color filter having improved luminance and contrast ratio and improved dissolution resistance without color migration.

BEST MODE

Hereinafter, embodiments of the present invention are described in detail. However, these embodiments are exemplary, the present invention is not limited thereto and the present invention is defined by the scope of claims.

As used herein, when specific definition is not otherwise provided, "substituted" refers to replacement of at least one hydrogen of the functional group of the present invention by at least one substituent selected from a halogen atom (F, Br, Cl, or I), a hydroxy group, a nitro group, a cyano group, an amino group ($NH_2$, $NH(R^{200})$, or $N(R^{201})(R^{202})$, wherein $R^{200}$, $R^{201}$ and $R^{202}$ are the same or different and are each independently a C1 to C10 alkyl group), an amidino group, a hydrazine group, a hydrazone group, a carboxyl group, a substituted or unsubstituted alkyl group, a substituted or unsubstituted alkenyl group, a substituted or unsubstituted alkynyl group, a substituted or unsubstituted alicyclic organic group, a substituted or unsubstituted aryl group, and a substituted or unsubstituted heterocyclic group.

As used herein, when specific definition is not otherwise provided, "alkyl group" refers to a C1 to C20 alkyl group, and specifically a C1 to C15 alkyl group, "cycloalkyl group" refers to a C3 to C20 cycloalkyl group, and specifically a C3 to C18 cycloalkyl group, "alkoxy group" refers to a C1 to C20 alkoxy group, and specifically a C1 to C18 alkoxy group, "aryl group" refers to a C6 to C20 aryl group, and specifically a C6 to C18 aryl group, "alkenyl group" refers to a C2 to C20 alkenyl group, and specifically a C2 to C18 alkenyl group, "alkylene group" refers to a C1 to C20 alkylene group, and specifically C1 to C18 alkylene group, and "arylene group" refers to a C6 to C20 arylene group, and specifically a C6 to C16 arylene group.

As used herein, when specific definition is not otherwise provided, "(meth)acrylate" refers to both "acrylate" and "methacrylate," and "(meth)acrylic acid" refers to "acrylic acid" and "methacrylic acid."

As used herein, when a definition is not otherwise provided, the term "combination" refers to mixing or copolymerization. In addition, "copolymerization" refers to block copolymerization or random copolymerization, and "copolymer" refers to block copolymerization or random copolymerization.

In the chemical formula of the present specification, unless a specific definition is otherwise provided, hydrogen is boned at the position when a chemical bond is not drawn where supposed to be given.

As used herein, when specific definition is not otherwise provided, "ethylenically unsaturated double bond" refers to "carbon-carbon double bond," and ethylenically unsaturated monomer refers to a monomer including the ethylenically unsaturated double bond.

As used herein, when specific definition is not otherwise provided, "*" indicates a point where the same or different atom or chemical formula is linked.

An embodiment provides a photosensitive resin composition including (A) a colorant including a xanthene-based dye and a blue pigment having an average particle diameter (D50) of less than 100 nm; (B) a binder resin including a radically polymerizable double bond; (C) a photopolymerizable compound; (D) a photopolymerization initiator; (E) a matting agent represented by Chemical Formula 1; and (F) a solvent.

[Chemical Formula 1]

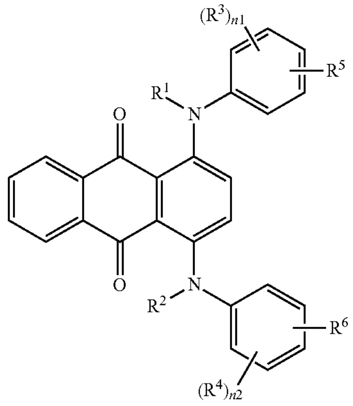

In Chemical Formula 1, $R^1$ to $R^4$ are each independently a hydrogen atom, a substituted or unsubstituted C1 to C20 alkyl group or a substituted or unsubstituted C6 to C20 aryl group, $R^5$ and $R^6$ are each independently a hydrogen atom, a substituted or unsubstituted C1 to C20 alkyl group, or a substituted or unsubstituted sulfonamide group, provided that at least one of $R^5$ and $R^6$ is a substituted or unsubstituted sulfonamide group, and n1 and n2 are each independently an integer of 1 to 3.

As described above, a color filter manufactured by using a pigment-type photosensitive resin composition has a limit in terms of luminance and a contrast ratio due to a pigment particle size. In addition, a color image sensor device for an image sensor requires a smaller dispersion particle diameter to form a fine pattern. In order to correspond to the requirements, an attempt to realize a color filter having improved luminance and a contrast ratio has been made by introducing a dye forming no particle instead of the pigment to prepare a photosensitive resin composition appropriate for the dye.

In general, an xanthene-based compound goes through charge separation, and a photosensitive resin composition including the same has low solubility in organic solvents such as PGMEA and the like and exhibits deteriorated dissolution resistance along with color migration, and accordingly, there is a limit to use the xanthene-based compound as a colorant in the photosensitive resin composition. However, the photosensitive resin composition according to an embodiment uses a colorant of mixing a xanthene-based dye and a blue pigment having a controlled average particle diameter (D50) and in addition, a matting agent with a specific structure and thus may secure color characteristics such as luminance, a contrast ratio, and the like and simultaneously, improve dissolution resistance without color migration.

Hereinafter, each component is described in detail.

(A) Colorant

The colorant includes a blue pigment having an average particle diameter (D50) of less than 100 nm together with a xanthene-based dye.

As described above, in order to compensate drawbacks of the conventional pigment-type photosensitive resin composition, an attempt to use a dye instead of a pigment is being continuously made, but there is still a high demand for a colorant simultaneously satisfying color characteristics, durability, and the like. The present inventors use a colorant in a hybrid form of the xanthene-based dye with the blue pigment but control the average particle diameter (D50) of the blue pigment to be less than 100 nm, preventing the deterioration of luminance and a contrast ratio.

For example, the xanthene-based dye may be represented by Chemical Formula 3.

[Chemical Formula 3]

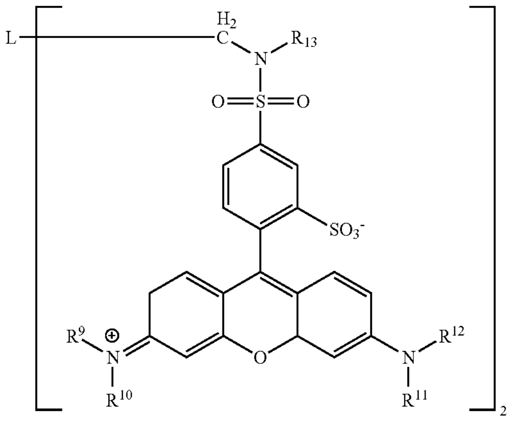

In Chemical Formula 3, $R^9$ to $R^{13}$ are each independently a hydrogen atom, a substituted or unsubstituted C1 to C20 alkyl group or a substituted or unsubstituted C6 to C20 aryl group, and L is a divalent linking group containing at least one aromatic ring.

For example, in Chemical Formula 3, L may be a substituted or unsubstituted C6 to C20 arylene group.

For example, in Chemical Formula 3, examples of the aromatic ring included in L may include a hydrocarbon-based aromatic ring, such as a benzene ring, a naphthalene ring, a tetralin ring, an indene ring, a fluorene ring, an anthracene ring, a phenanthrene ring, biphenyl, terphenyl, and a five membered ring such as furan, thiophene, pyrrole, oxazole, thiazole, imidazole, and pyrazole; a six-membered ring such as pyran, pyridine, pyridazine, pyrimidine, and pyrazine; and condensed rings such as benzofuran, thionaphthene, indole, carbazole, coumarin, quinoline, isoquinoline, acridine, quinazoline, and quinoxaline; but the present invention is not limited thereto. This aromatic ring may be further substituted by a substituent. Examples of such substituents may include, but are not limited to, a halogen such as fluorine, chlorine, and bromine, an alkyl group, a carboxyl group, and an amino group. For example, L may include a C6 to C14 hydrocarbon-based aromatic ring. For example, L may include a benzene ring or a naphthalene ring. For example, L may be a divalent phenylene group.

For example, in Chemical Formula 3, $R^9$ and $R^{10}$, or $R^{11}$ and $R^{12}$ may be bonded to each other to form a cyclic structure. Such a cyclic structure may include at least one hetero atom, for example nitrogen, sulfur, and oxygen. Examples of the cyclic structure include the following structures, but the present invention is not limited thereto.

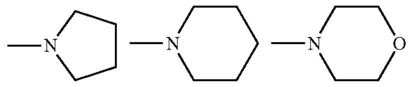

For example, the xanthene-based dye represented by Chemical Formula 3 has significantly improved stability, particularly thermal stability due to the presence of a methylene group (*—$CH_2$—*) between L and the xanthene moiety without intending to be limited by theory, and furthermore, it is considered to have remarkably excellent dispersibility from the viewpoint of steric hindrance.

Meanwhile, the blue pigment should have an average particle diameter (D50) of less than 100 nm, for example, greater than or equal to 30 nm and less than 100 nm. When a blue pigment having an average particle diameter (D50) of greater than 100 nm is used, color characteristics of the composition is greatly deteriorated, and the luminance and contrast ratio are greatly reduced, which is not preferable.

For example, the xanthene-based dye may be included in a less amount than that of the blue pigment based on the solid content.

For example, examples of the blue pigment may include phthalocyanine-based pigment such as C.I. blue pigment 15:6, C.I. blue pigment 15, C.I. blue pigment 15:1, C.I. blue pigment 15:2, C.I. blue pigment 15:3, C.I. blue pigment 15:4, C.I. blue pigment 15:5, C.I. blue pigment 16, and the like. However, the type of the blue pigment is not limited thereto.

For example, the blue pigment may be included in the photosensitive resin composition in the form of a dispersion.

The blue pigment may be used in the form of a dispersion together with a dispersion resin in order to disperse it. Specifically, the dispersion resin may be added together with the blue pigment when preparing the photosensitive resin composition.

The dispersion resin may be a polymer having a weight average molecular weight of 5000 g/mol to 10000 g/mol, and an acid value of 80 KOHmg/g to 150 KOHmg/g.

The dispersion resin may include at least one selected from structural units represented by Chemical Formula 4-3, Chemical Formula 4-4, Chemical Formula 4-5 and Chemical Formula 4-6.

[Chemical Formula 4-3]

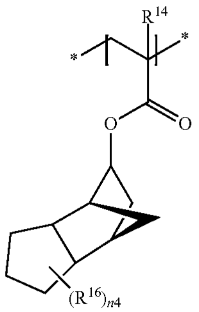

[Chemical Formula 4-4]

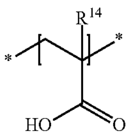

-continued

[Chemical Formula 4-5]

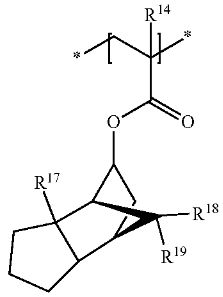

[Chemical Formula 4-6]

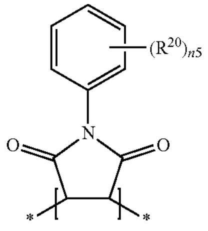

In Chemical Formula 4-3 to Chemical Formula 4-6, $R^{14}$ is a hydrogen atom or a substituted or unsubstituted C1 to C20 alkyl group, $R^{16}$ to $R^{20}$ are each a substituted or unsubstituted C1 to C20 alkyl group or a substituted or unsubstituted C6 to C20 aryl group, n4 is an integer of 0 to 3, and n5 is an integer of 0 to 5.

It may be desirable that the dispersion resin is necessarily used in the form of a dispersion together with the blue pigment. When the dispersion resin is used as a separate binder resin rather than the role of the dispersion resin for dispersing the blue pigment, color migration may occur, and above all, dissolution resistance may be greatly reduced, which may be undesirable.

Meanwhile, the dispersion may further include a dispersing agent, and as the dispersing agent, a non-ionic dispersing agent, an anionic dispersing agent, a cationic dispersing agent, and the like may be used. Specific examples of the dispersing agent include polyalkylene glycol and an ester thereof, polyoxyalkylene, a polyhydric alcohol ester alkylene oxide adduct, an alcohol alkylene oxide adduct, a sulfonic acid ester, a sulfonate, a carboxylic acid ester, a carboxylate, an alkyl amide alkylene oxide adduct, an alkyl amine, and the like, and these may be used alone or in combination of two or more.

For example, the commercially available products of the dispersing agent are DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like of BYK Co., Ltd.; EFKA-47, EFKA-47EA, EFKA-48, EFKA-49, EFKA-100, EFKA-400, EFKA-450, and the like of EFKA Chemicals Co.; Solsperse 5000, Solsperse 12000, Solsperse 13240, Solsperse 13940, Solsperse 17000, Solsperse 20000, Solsperse 24000GR, Solsperse 27000, Solsperse 28000, and the like of Zeneka Co.; or PB711, PB821, and the like of Ajinomoto Inc.

The dispersing agent may be included in an amount of 0.1 wt % to 15 wt % based on the total amount of dispersion. When the dispersing agent is included within the above range, stability, developability, and patternability of a composition containing it as a colorant are improved.

The blue pigment may be used after pre-treatment using a water-soluble inorganic salt and a wetting agent. When the blue pigment is used after the pre-treatment, the primary particle diameter of the yellow pigment may become finer.

The pre-treatment may be performed by kneading the blue pigment with a water-soluble inorganic salt and a wetting agent and then, filtering and washing the knead blue pigment.

The kneading may be performed at a temperature ranging from 40° C. to 100° C., and the filtering and washing may be performed by filtering the pigment after washing away an inorganic salt with water and the like.

Examples of the water-soluble inorganic salt may be sodium chloride, potassium chloride, and the like, but are not limited thereto. The wetting agent may make the pigment to be uniformly mixed with the water-soluble inorganic salt uniformly and be pulverized. Examples of the wetting agent may include alkylene glycol monoalkylether such as ethylene glycol monoethylether, propylene glycol monomethylether, or diethylene glycol monomethylether; an alcohol such as ethanol, isopropanol, butanol, hexanol, cyclohexanol, ethylene glycol, diethylene glycol, polyethylene glycol, glycerine polyethylene glycol. These may be used alone or in combination of two or more.

The blue pigment after the kneading may have an average particle diameter of less than 100 nm, for example greater than or equal to 30 nm and less than 100 nm. When the average particle diameter of the blue pigment is within the above range, the stability in the pigment dispersion may be improved, and the color characteristics (luminance, contrast ratio, etc.) of the composition may be prevented from being deteriorated.

More specifically, the blue pigment may be used in the form of a blue pigment dispersion including the dispersion resin and a solvent such as PGMEA, and the blue pigment dispersion may include a solid blue pigment, a dispersion resin, and a solvent. The solid blue pigment may be included in an amount of 15 wt % to 40 wt %, for example, 20 wt % to 30 wt %, based on the total amount of the blue pigment dispersion.

The colorant may be included in an amount of 20 wt % to 40 wt %, for exam 3 wt % to 20 wt %, based on the total amount of the photosensitive resin composition. When the colorant is included within the above range, the coloring effect and developing performance may be improved.

(B) Binder Resin

The binder resin includes a radically polymerizable double bond. For example, the binder resin may be an acryl-based binder resin including a radically polymerizable double bond.

The binder resin should include a radically polymerizable double bond, such as a carbon-carbon double bond. When the binder resin does not include a radically polymerizable double bond, color migration may occur, and above all, dissolution resistance is greatly reduced, which is not desirable.

The acryl-based resin is a copolymer of a first ethylenically unsaturated monomer and a second ethylenically unsaturated monomer copolymerizable therewith, and is a resin including at least one acryl-based repeating unit.

The first ethylenically unsaturated monomer may be an ethylenically unsaturated monomer including one or more carboxyl groups, and specific examples thereof may include acrylic acid, methacrylic acid, maleic acid, itaconic acid, fumaric acid, or a combination thereof.

The first ethylenically unsaturated monomer may be included in an amount of 5 wt % to 50 wt %, for example 10 wt % to 40 wt %, based on the total amount of the acryl-based binder resin.

The second ethylenically unsaturated monomer may include aromatic vinyl compounds such as styrene, α-methylstyrene, vinyltoluene, and vinylbenzylmethylether; unsaturated carboxylic acid ester compounds such as methyl (meth)acrylate, ethyl (meth)acrylate, butyl (meth)acrylate, 2-hydroxyethyl (meth)acrylate, 2-hydroxy butyl (meth)acrylate, benzyl (meth)acrylate, cyclohexyl (meth)acrylate and phenyl (meth)acrylate; unsaturated carboxylic acid amino alkyl ester compounds such as 2-aminoethyl (meth)acrylate and 2-dimethylaminoethyl (meth)acrylate; carboxylic acid vinyl ester compounds such as vinyl acetate and vinyl benzoate; unsaturated carboxylic acid glycidyl ester compounds such as glycidyl (meth)acrylate; vinyl cyanide compounds such as (meth)acrylonitrile; unsaturated amide compounds such as (meth)acrylamide; and the like, and these may be used alone or in combination of two or more.

Specific examples of the acryl-based binder resin may be a (meth)acrylic acid/benzylmethacrylate copolymer, a (meth)acrylic acid/benzylmethacrylate/styrene copolymer, a (meth)acrylic acid/benzylmethacrylate/2-hydroxyethylmethacrylate copolymer, a (meth)acrylic acid/benzylmethacrylate/styrene/2-hydroxyethylmethacrylate copolymer, and the like, but the present invention is not limited thereto. These may be used alone or as a mixture of two or more.

For example, the binder resin may include a structural unit represented by Chemical Formula 4-1.

[Chemical Formula 4-1]

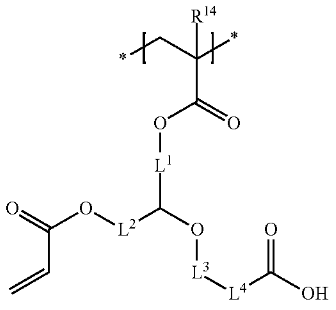

In Chemical Formula 4-1, $R^{14}$ is a hydrogen atom or a substituted or unsubstituted C1 to C20 alkyl group, $L^1$ to $L^3$ are each independently a single bond or a substituted or unsubstituted C1 to C20 alkylene group, and $L^4$ is a divalent linking group including a carbon-carbon double bond.

For example, in Chemical Formula 4-1, $L^4$ may be any one selected from linking groups represented by L-1 to L-5, but is not limited thereto.

[Chemical Formula L-1]

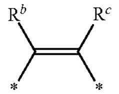

In Chemical Formula L-1, $R^b$ and $R^c$ are independently hydrogen, a substituted or unsubstituted C1 to C20 alkyl group, an ester group, or an ether group.

[Chemical Formula L-2]

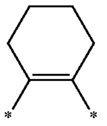

[Chemical Formula L-3]

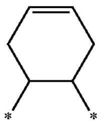

[Chemical Formula L-4]

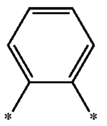

[Chemical Formula L-5]

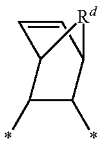

In Chemical Formula L-5, $R^d$ is O, S, NH, a substituted or unsubstituted C1 to C20 alkylene group, a C1 to C20 alkylamine group, or a C2 to C20 alkenylamine group.

For example, the binder resin may further include a structural unit represented by Chemical Formula 4-2, a structural unit represented by Chemical Formula 4-3, or a combination thereof.

[Chemical Formula 4-2]

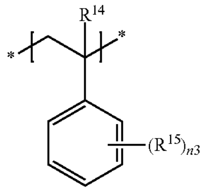

[Chemical Formula 4-3]

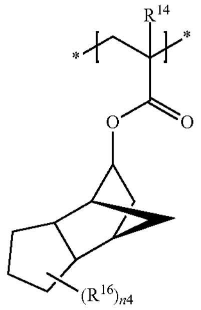

In Chemical Formula 4-2 and Chemical Formula 4-3, $R^{14}$ is a hydrogen atom or a substituted or unsubstituted C1 to C20 alkyl group, $R^{15}$ and $R^{16}$ are each independently a substituted or unsubstituted C1 to C20 alkyl group or a substituted or unsubstituted C6 to C20 aryl group, n3 is an integer of 0 to 5, and n4 is an integer of 0 to 3.

For example, the binder resin may have a double bond equivalent of 300 g/mol to 700 g/mol. When the binder resin has a double bond equivalent within the above range, dissolution resistance of the composition may be improved.

For example, the weight average molecular weight of the binder resin may be 5,000 g/mol to 20,000 g/mol, for example 5,000 g/mol to 10,000 g/mol, for example 6,000 g/mol to 8,000 g/mol. When the weight average molecular weight of the binder resin is within the above range, the photosensitive resin composition has improved physical and chemical properties, has an appropriate viscosity, and has excellent close contacting property to a substrate when manufacturing a color filter.

The acid value of the acryl-based binder resin may be 20 mgKOH/g to 90 mgKOH/g, for example, 50 mgKOH/g to 70 mgKOH/g. When the acid value of the binder resin is within the above range, the resolution of the pixel pattern is improved.

The acryl-based binder resin may be included in an amount of 0.5 wt % to 20 wt %, for example, 1 wt % to 10 wt %, based on the total amount of the photosensitive resin composition. When the binder resin is included within the above range, excellent developability and improved cross-linking properties may be obtained during the manufacture of a color filter, thereby obtaining excellent surface smoothness.

(C) Photopolymerizable Compound

The photopolymerizable compound may be mono-functional or multi-functional ester of (meth)acrylic acid including at least one ethylenic unsaturated double bond.

The photopolymerizable compound has the ethylenic unsaturated double bond and thus, may cause sufficient polymerization during exposure in a pattern-forming process and form a pattern having excellent heat resistance, light resistance, and chemical resistance.

Specific examples of the photopolymerizable compound may be ethylene glycol di(meth)acrylate, diethylene glycol di(meth)acrylate, triethylene glycol di(meth)acrylate, propylene glycol di(meth)acrylate, neopentyl glycol di(meth) acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth) acrylate, dipentaerythritol di(meth)acrylate, dipentaerythritol tri(meth)acrylate, dipentaerythritol penta(meth) acrylate, dipentaerythritol hexa(meth)acrylate, bisphenol A epoxy(meth)acrylate, ethylene glycol monomethylether (meth)acrylate, trimethylol propane tri(meth)acrylate, tris (meth)acryloyloxyethyl phosphate, novolac epoxy (meth) acrylate, and the like.

Commercially available examples of the photopolymerizable compound are as follows. The mono-functional (meth)acrylic acid ester may include Aronix M-101®, M-111®, M-114® (Toagosei Chemistry Industry Co., Ltd.); KAYARAD TC-110S®, TC-120S® (Nippon Kayaku Co., Ltd.); V-158®, V-2311® (Osaka Organic Chemical Ind., Ltd.), and the like. Examples of a difunctional (meth)acrylic acid ester may include Aronix M-210®, M-240®, M-6200® (Toagosei Chemistry Industry Co., Ltd.), KAYARAD HDDA®, HX-220®, R-604® (Nippon Kayaku Co., Ltd.), V-260®, V-312®, V-335 HP® (Osaka Organic Chemical Ind., Ltd.), and the like. Examples of a tri-functional (meth) acrylic acid ester may include Aronix M-309®, M-400®, M-405®, M-450®, M-710®, M-8030®, M-8060®, and the like of Toagosei Chemistry Industry Co., Ltd.; KAYARAD TMPTA®, DPCA-20®, DPCA-30®, DPCA-60®, DPCA-120® of Nippon Kayaku Co., Ltd., V-295®, V-300®, V-360®, V-GPT®, V-3PA®, V-400® of Osaka Yuki Kayaku Kogyo Co. Ltd., and the like. These may be used alone or as a mixture of two or more.

The photopolymerizable compound may be treated with acid anhydride to improve developability.

The photopolymerizable compound may be included in an amount of 1 wt % to 20 wt %, for example 1 wt % to 10 wt % based on the total amount of the photosensitive resin composition. When the photopolymerizable compound is included within the ranges, the photopolymerizable monomer is sufficiently cured during exposure in a pattern-forming process and has excellent reliability, and developability for alkali developing solution may be improved.

(D) Photopolymerization Initiator

The photopolymerization initiator may be a generally-used initiator in a photosensitive resin composition, for example an acetophenone-based compound, a benzophenone-based compound, a thioxanthone-based compound, a benzoin-based compound, a triazine-based compound, an oxime-based compound, or a combination thereof.

Examples of the acetophenone-based compound may be 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone-based compound may be benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylamino-benzophenone, 4,4'-dichlorobenzophenone, 3,3'-dimethyl-2-methoxybenzophenone, and the like.

Examples of the thioxanthone-based compound may be thioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin-based compound may be benzoin, benzoin methyl ether, benzoin ethyl ether, benzoin isopropyl ether, benzoin isobutyl ether, benzyldimethylketal, and the like.

Examples of the triazine-based compound may be 2,4,6-trichloro-s-triazine, 2-phenyl 4,6-bis(trichloromethyl)-s-triazine, 2-(3', 4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphthol-yl)-4,6-bis (trichloromethyl)-s-triazine, 2-(4-methoxynaphthol-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like.

Examples of the oxime-based compound may be O-acyloxime-based compound, 2-(o-benzoyloxime)-1-[4-(phenylthio)phenyl]-1,2-octandione, 1-(o-acetyloxime)-1-[9-ethyl-6-(2-methylbenzoyl)-9H-carbazol-3-yl]ethanone, O-ethoxycarbonyl-α-oxyamino-1-phenylpropan-1-one, and the like. Specific examples of the O-acyloxime-based compound may be 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione-2-oxime-O-benzoate, 1-(4-phenylsulfanyl phenyl)-octane-1,2-dione-2-oxime-O-benzoate, 1-(4-phenylsulfanyl phenyl)-octan-1-oneoxime-O-acetate, 1-(4-phenylsulfanyl phenyl)-butan-1-oneoxime-O-acetate, and the like.

The photopolymerization initiator may further include a carbazole-based compound, a diketone series compound, a sulfonium borate-based compound, a diazo-based compound, an imidazole-based compound, a biimidazole-based compound, and the like, besides the compounds.

The photopolymerization initiator may be used with a photosensitizer capable of causing a chemical reaction by absorbing light and becoming excited and then, transferring its energy.

Examples of the photosensitizer may be tetraethylene glycol bis-3-mercapto propionate, pentaerythritol tetrakis-3-mercapto propionate, dipentaerythritol tetrakis-3-mercapto propionate, and the like.

The photopolymerization initiator may be included in an amount of 0.1 wt % to 5 wt %, for example 0.1 wt % to 3 wt % based on the total amount of the photosensitive resin composition. When the photopolymerization initiator is included within the ranges, sufficient curing occurs during exposure in a pattern-forming process, excellent reliability may be realized, heat resistance, light resistance, and chemical resistance of patterns, resolution and close-contacting properties may be improved, and decrease of transmittance due to a non-reaction initiator may be prevented.

(E) Matting Agent

The photosensitive resin composition according to an embodiment includes a matting agent represented by Chemical Formula 1. By including the matting agent, the photosensitive resin composition according to the embodiment may prevent the contrast ratio from being lowered. That is, since the photosensitive resin composition according to an embodiment has the aforementioned colorant composition as an essential component, the contrast ratio may be lowered. However, by including the matting agent represented by Chemical Formula 1, the lowering of the contrast ratio may be suppressed. Specifically, the quencher represented by Chemical Formula 1 serves to absorb fluorescence from the colorant.

For example, in Chemical Formula 1, both $R^5$ and $R^6$ may be a substituted or unsubstituted sulfonamide group.

For example, in Chemical Formula 1, the substituted or unsubstituted sulfonamide group may be represented by Chemical Formula 2.

[Chemical Formula 2]

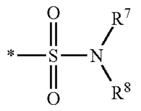

In Chemical Formula 2, $R^7$ and $R^8$ are each independently a hydrogen atom, a substituted or unsubstituted C1 to C20 alkyl group, a substituted or unsubstituted C3 to C20 cycloalkyl group, or a substituted or unsubstituted C6 to C20 aryl group.

For example, the matting agent represented by Chemical Formula 1 may have a symmetrical structure.

For example, the matting agent represented by Chemical Formula 1 may have a weight average molecular weight of greater than or equal to 540 g/mol.

Even if the matting agent has a structure represented by Chemical Formula 1, when the weight average molecular weight is less than 540 g/mol, the weight average molecular weight itself is too small, and color migration may occur, which may not be desirable. In general, the matting agent has a property of sublimation when subjected to heat, and when the matting agent sublimes in the composition during the thermal process, the color migration characteristics are inevitably reduced. However, when the weight average molecular weight of the matting agent of the structure represented by Chemical Formula 1 is controlled to 540 g/mol or more, the sublimation may be suppressed to some extent even during the thermal process, thereby preventing reduction of the color migration characteristics.

The matting agent may be included in an amount of 0.01 wt % to 1 wt %, for example 0.05 wt % to 1 wt %, based on the total amount of the photosensitive resin composition. When the matting agent is included within the above range, it may be effective to improve color migration characteristics.

(F) Solvent

The solvent is a material having compatibility with the colorant, the binder resin, the photopolymerizable compound, and the photopolymerization initiator, but not reacting therewith.

Examples of the solvent may include alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol monomethyl ether acetate, propylene glycol propyl ether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; alkyl lactate esters such as methyl lactate, ethyl lactate, and the like; oxy alkyl acetate esters such as oxy methyl acetate, oxy ethyl acetate, oxy butyl acetate, and the like; alkoxy alkyl acetates ester such as methoxy methyl acetate, methoxy ethyl acetate, methoxy butyl acetate, ethoxy methyl acetate, ethoxy ethyl acetate, and the like; 3-oxy alkyl propionate esters such as 3-oxy methyl propionate, 3-oxy ethyl propionate, and the like; 3-alkoxy alkyl propionate esters such as 3-methoxy methyl propionate, 3-methoxy ethyl propionate, 3-ethoxy ethyl propionate, 3-ethoxy methyl propionate, and the like; 2-oxy alkyl propionate esters such as 2-oxy methyl propionate, 2-oxy ethyl propionate, 2-oxy propyl propionate, and the like; 2-alkoxy alkyl propionate esters such as 2-methoxy methyl propionate, 2-methoxy ethyl propionate, 2-ethoxy ethyl propionate, 2-ethoxy methyl propionate, and the like; 2-oxy-2-methyl propionate esters such as 2-oxy-2-methyl methyl propionate, 2-oxy-2-methyl ethyl propionate, and the like, monooxy monocarboxylic acid alkyl ester of 2-alkoxy-2-methyl alkyl propionate such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate, and the like; ketonic acid esters such as ethyl pyruvate, and the like, a high boiling point solvent such as N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ butyrolactone, ethylene carbonate, propylene carbonate, phenyl cellosolve acetate, and the like.

Considering compatibility and reactivity, glycol ethers such as ethylene glycol monoethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates such as propylene glycol monomethylether acetate, propylene glycol propylether acetate, and the like may be desirably used.

The solvent may be included in a balance amount, for example, 25 wt % to 90 wt %, based on the total amount of the photosensitive resin composition. When the solvent is included within the above range, since the photosensitive resin composition has an appropriate viscosity, processability in manufacturing the color filter may be improved.

(G) Other Additives

The photosensitive resin composition may further include at least one additive selected from malonic acid; 3-amino-1,2-propanediol; a coupling agent including a vinyl group or a (meth)acryloxy group; a leveling agent; and a surfactant in order to prevent stains or spots during the coating, to improve leveling performance, or to prevent residue generation due to non-development.

The additive may be adjusted according to desired properties.

The coupling agent may be a silane-based coupling agent, and examples of the silane-based coupling agent include trimethoxysilyl benzoic acid, γ-methacryl oxypropyl trimethoxysilane, vinyl triacetoxysilane, vinyl trimethoxysilane, γ Isocyanate propyl triethoxysilane, γ glycidoxy propyl trimethoxysilane, β epoxycyclohexyl) ethyl trimethoxysilane, etc., and these may be used alone or in mixture of 2 or more types.

Specifically, the silane-based coupling agent may be used in an amount of 0.01 part by weight to 1 part by weight based on 100 parts by weight of the photosensitive resin composition.

In addition, the photosensitive resin composition for a color filter may further include a surfactant, such as a fluorine-based surfactant, if necessary.

Examples of the fluorine-based surfactant include F-554, F-482, F-484, F-478, and the like of DIC Co., Ltd., but are not limited thereto.

The surfactant may be desirably included in an amount of 0.01 wt % to 5 wt %, more desirably 0.01 wt % to 2 wt %, based on the total amount of the photosensitive resin composition. If it is out of the above range, foreign particles may be generated after development.

The photosensitive resin composition may further include an epoxy compound to improve close contacting property with the substrate.

Examples of the epoxy compound include a phenol novolac epoxy compound, a tetramethyl biphenyl epoxy compound, a bisphenol A-type epoxy compound, an alicyclic epoxy compound, or a combination thereof.

The epoxy compound may be included in an amount of 0.01 parts by weight to 20 parts by weight, for example 0.1 parts by weight to 10 parts by weight, based on 100 parts by weight of the photosensitive resin composition. When the epoxy compound is included within the above range, close contacting property and storage capability may be improved.

In addition, the photosensitive resin composition may further include other additives such as an oxidization inhibitor, a stabilizer, and the like in a predetermined amount, unless properties are deteriorated.

According to another embodiment, a photosensitive resin layer manufactured using the photosensitive resin composition is provided.

According to another embodiment, a color filter including the photosensitive resin layer is provided.

A pattern-forming process in the color filter is as follows.

The process includes coating the photosensitive resin composition according to an embodiment on a support substrate in a method of spin coating, slit coating, inkjet printing, and the like; drying the coated positive photosensitive resin composition to form a photosensitive resin composition layer; exposing the positive photosensitive resin composition layer to light; developing the exposed positive photosensitive resin composition layer in an alkali aqueous solution to obtain a photosensitive resin layer; and heat-treating the photosensitive resin layer.

Conditions for the patterning process are well known in a related art and will not be illustrated in detail in the specification.

MODE FOR INVENTION

Hereinafter, the present invention is illustrated in more detail with reference to examples, but these examples, however, are not in any sense to be interpreted as limiting the scope of the invention.

(Colorant)

Synthesis Example 1

10 parts by weight of a B15:6 pigment, 6 parts by weight of DISPERBYK-2000, 4 parts by weight of a dispersion resin represented by Chemical Formula P based on a solid content, and 80 parts by weight of propylene glycol monomethylether acetate (PGMEA) were mixed with zirconia beads and a shaker (Skandex) to obtain dispersion, wherein the B15:6 pigment had an average particle size D50 of 39.5 nm.

[Chemical Formula P]

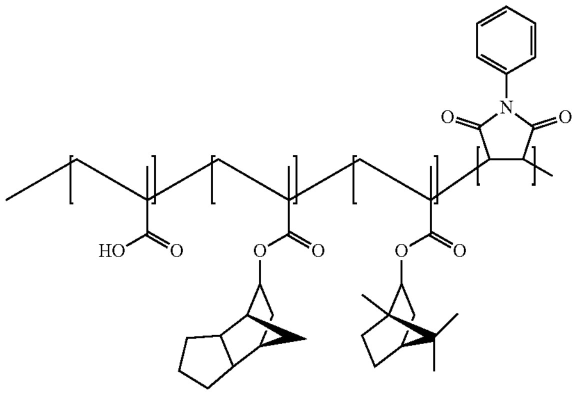

(Synthesis Method of Dispersion Resin Represented by Chemical Formula P)

2 g of AIBN as an initiator was put in a 100 ml beaker, and 20 wt % of MAA, 55 wt % of TSDMA, 5 wt % of IBXMA, and 20 wt % of PMI based on 40 g of the sum of the monomers were sequentially added thereto and then, stirred for 30 minutes. Subsequently, in order to conduct a polymerization reaction, 100 g of PGMEA was put in a 250 ml glass reactor with a cooler and heated up to 85° C., and the prepared monomer solution was added thereto in a dropwise fashion for 3 hours. After proceeding with the reaction at the same temperature for 6 hours the temperature was lowered down to room temperature, completing the reaction, and the reaction was performed under a nitrogen atmosphere, synthesizing a dispersion resin having a weight average molecular weight of 7800 g/mol and an acid value of 110 KOHmg/g.

Comparative Synthesis Example 1

10 parts by weight of a B15:6 pigment, 6 parts by weight of DISPERBYK-2000, 4 parts by weight of the dispersion resin represented by Chemical Formula P, and 80 parts by weight of propylene glycol monomethylether acetate (PGMEA) were mixed by using zirconia beads and a shaker (Skandex), obtaining dispersion, wherein the B15:6 pigment had an average particle size D50 of 108.7 nm.

Synthesis Example 2

8 parts by weight of the B15:6 pigment, 2 parts by weight of a xanthene-based dye represented by Chemical Formula 3-1 (maldi-tof MS:1234.42 m/z), 6 parts by weight of DISPERBYK-2000, 4 parts by weight of the dispersion resin represented by Chemical Formula P, and 80 parts by weight of propylene glycol monomethylether acetate (PGMEA) were mixed by using zirconia beads and a shaker (Skandex), obtaining dispersion, wherein the B15:6 pigment had an average particle size D50 of 40.6 nm.

[Chemical Formula 3-1]

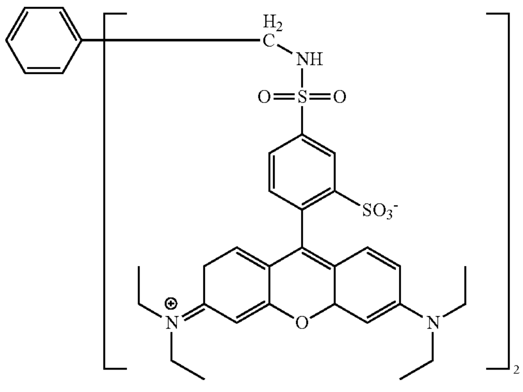

Comparative Synthesis Example 2

8 parts by weight of the B15:6 pigment, 2 parts by weight of the xanthene-based dye represented by Chemical Formula 3-1, 6 parts by weight of DISPERBYK-2000, 4 parts by weight of the dispersion resin represented by Chemical Formula P, and 80 parts by weight of propylene glycol monomethylether acetate (PGMEA) were mixed by using zirconia beads and a shaker (Skandex), obtaining dispersion, wherein the B15:6 pigment had an average particle size D50 of 119.8 nm.

(Matting Agent)

Example 3

A matting agent represented by Chemical Formula 1-1 (3,3'-[(9,10-dihydro-9,10-dioxo-1,4-anthrylene)diimino]bis [n-cyclohexyl-2,4,6-trimethylbenzenesulphonamide], Alfa Chemistry) was used.

[Chemical Formula 1-1]

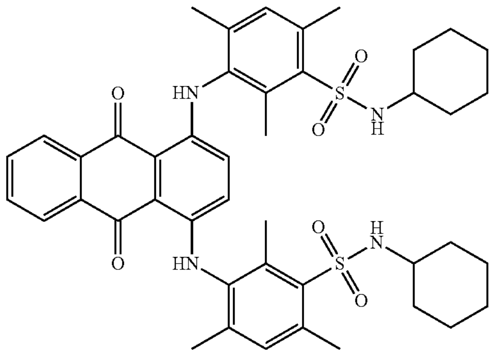

Maldi-tof MS: 796.33 m/z

Comparative Example 3

A matting agent represented by Chemical Formula 1-2 (Sigma Aldrich, Oil Bule N) was used.

[Chemical Formula 1-2]

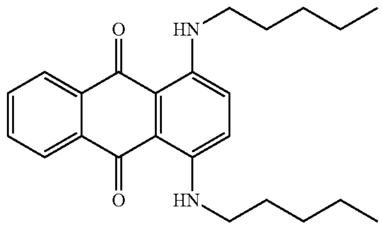

Maldi-tof MS: 378.23 m/z (Binder Resin)

Synthesis Example 4

262 g of propylene glycolmonomethyl ether acetate was put in a flask equipped with a stirring device, a dripping device, a condenser, a thermometer, a gas inlet tube, and the like and then, stirred, while substituted with nitrogen, and then, heated up to 120° C. Subsequently, 19 g of t-butylperoxy-2-ethylhexanoate (Perbutyl O, NOF Corporation) was added to a monomer mixture consisting of 47.9 g of a styrene monomer, 99.4 g of glycidylmethacrylate, and 6.6 g of TCDMA and then, added to the flask in a dropwise fashion over 2 hours from the dripping device. When the addition was completed, the mixture was further stirred at 120° C. for 2 hours to conduct a polymerization reaction. Subsequently, after the flask was internally substituted with the air, 50.4 g of acrylic acid, 0.6 g of triphenylphosphine, and 0.2 g of methylhydroquinone were added to the polymer solution and then, continuously reacted at 110° C. over 10 hours to introduce a radically polymerizable double bond into a side chain. Subsequently, 21.3 g of tetrahydrophthalic anhydride was added to the polymer solution to continue the reaction at 110° C. over 3 hours and thus introduce a carboxyl group into the side chain, synthesizing a binder resin represented by Chemical Formula 4 and having a weight average molecular weight of 6400 g/mol, an acid value of 32 KOHmg/g, and a double bond equivalent of 350 g/mol.

[Chemical Fomula 4]

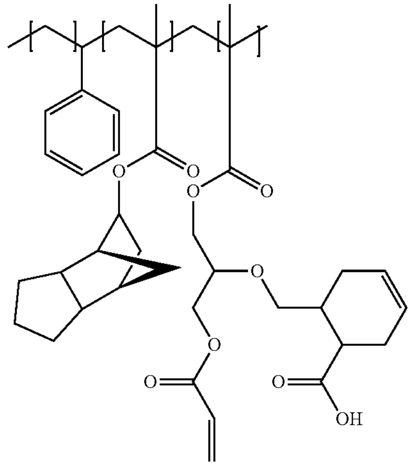

(Synthesis of Photosensitive Resin Composition)

Example 1, Reference Example 1, and Comparative Examples 1 to 3

Photosensitive resin compositions according to Example 1, Reference Example 1, and Comparative Examples 1 and 3 were respectively prepared to have each composition by using components shown in Table 1.

Specifically, a photopolymerization initiator was dissolved in a solvent and then, stirred for 2 hours at room temperature, and a binder resin and a photopolymerizable compound were added thereto and then, stirred for 2 hours at room temperature. Then, a colorant was added to the reactant and then, stirred for 1 hour at room temperature. A product therefrom was three times filtered to remove impurities, preparing the photosensitive resin compositions.

TABLE 1

(unit: wt %)

| | | Example 1 | Reference Example 1 | Comparative Example 1 | Comparative Example 2 | Comparative Example 3 |
|---|---|---|---|---|---|---|
| (A) Colorant | A-1 | 22.29 | 22.89 | — | 22.89 | 22.89 |
| | A-2 | — | — | 22.89 | — | — |
| | A-3 | 6.5 | 6.5 | — | 6.5 | 6.5 |
| | A-4 | — | — | 6.5 | — | — |
| (E) Matting agent | E-1 | 0.12 | — | 0.12 | — | 0.12 |
| | E-2 | — | 0.12 | — | — | — |
| (B) Binder resin | Chemical Formula 4 | 5.57 | 5.57 | 5.57 | 5.57 | — |
| | Chemical Formula P | — | — | — | — | 5.57 |
| (C) Photopolymerizable compound | | 5.72 | 5.72 | 5.72 | 5.72 | 5.72 |
| (D) Photopolymerization initiator | | 0.64 | 0.64 | 0.64 | 0.64 | 0.64 |
| (F) Solvent | | 58.56 | 58.56 | 58.56 | 58.68 | 58.56 |

(A) Colorant
(A-1) Colorant according to Synthesis Example 1
(A-2) Colorant according to Comparative Synthesis Example 1
(A-3) Colorant according to Synthesis Example 2
(A-4) Colorant according to Comparative Synthesis Example 2
(C) Photopolymerizable compound Dipentaerythritolhexaacrylate (DPHA) (Nippon Kayaku Co. Ltd.)
(D) Photopolymerization initiator SPI-03 (Samyang Corporation)
(E) Matting agent
(E-1) Synthesis Example 3
(E-2) Comparative Synthesis Example 3
(F) Solvent Propylene glycol monomethyl ether acetate (PGMEA) (SIGMA-ALDRICH)

Evaluation: Color Characteristics, Color Migration Characteristics, and Dissolution Resistance The photosensitive resin compositions according to Example 1, Reference Example 1, and Comparative Examples 1 to 3 were respectively coated to be 1 μm to 3 μm thick with a MS-A150 spin coater (MIKASA Co., Ltd.) at 250 rpm to 350 rpm on a glass substrate, which was degreased and washed, and then, prebaked on a 90° C. hot plate for 90 seconds to remove the solvents. Then, the coated compositions were exposed at 60 mJ/cm$^2$ with a 500 W ultra-high UV lamp, developed in a 111×KOH developing solution for 60 seconds by using a developer (AD-2000, Takizawa Sangyo Co., Ltd.), and washed with DIW under a pressure of 1.0 Kgf/cm$^2$ for 60 seconds, obtaining specimens. Subsequently, the specimens were post-baked at 240° C. in a hot air oven for 20 minutes. Then, luminance, contrast ratios, color migration characteristics, and dissolution resistance thereof were measured, and the results are shown in Table 2.

(Measurement of Luminance)

The specimens were measured with respect to chromaticity by using MCPD-3000 made by Otsuka Electronics Co., Ltd. Color data of three sheets of each specimen were used to calculate luminance at y=0.102 through linear regression, and the luminance was regarded as luminance of the corresponding composition.

(Measurement of Contrast Ratio)

Three sheets of each specimen were measured with respect to a contrast ratio by using CT-1 made by Tsubosaka Electronic Co., Ltd. Color and contrast ratio data of the three sheets of each specimen were used to calculate a corresponding contrast ratio at y=0.102 through using linear regression, and this contrast ratio was regarded as a contrast ratio of the corresponding composition.

(Measurement of Color Migration Characteristics)

Color data of three sheets of each specimen were used to calculate x at y=0.565, and the x, y was used as a color coordinate of the corresponding composition. Subsequently, the compositions according to Example 1, Reference Example 1, and Comparative Examples 1 to 3 were respectively coated on each specimen and then, developed without the exposure, washed, and post-baked, and then, chromaticity thereof was measured to calculate x at y=0.565 through linear regression, and the x, y was regarded as a color coordinate after the additional processes. Herein, a difference in the x-coordinates (x color coordinate after the additional processes—x color coordinate after the additional processes) corresponds to a degree of color migration. (The larger an absolute value, the more the degree of color migration)

(Dissolution Resistance)

The specimens manufactured as described above were cut into 1 cm×5 cm, dipped with 17 ml of NMP in a 20 ml vial, allowed to stand at 80° C. for 5 minutes, and taken out therefrom. The remaining solution was measured with respect to absorbance at 200 nm to 800 nm by using a UV-Vis spectrophotometer made by Agilent Technologies Inc. to check maximum absorbance.

TABLE 2

| | Luminance (%) larger is better | Contrast ratio (%) larger is better | Color migration (abs. Δx) smaller is better | Dissolution resistance smaller is better |
|---|---|---|---|---|
| Example 1 | 100.0 | 100.0 | 0.0018 | 0.046 |
| Reference Example 1 | 99.8 | 101.8 | 0.0083 | 0.047 |
| Comparative Example 1 | 94.5 | 47.5 | 0.0023 | 0.041 |
| Comparative Example 2 | 100.9 | 93.8 | 0.0016 | 0.043 |
| Comparative Example 3 | 100.2 | 99.1 | 0.0032 | 0.157 |

Referring to Table 2, the photosensitive resin composition according to an embodiment (Example 1) exhibited excellent luminance and contrast ratio and also, excellent dissolution resistance without color migration, compared with the photosensitive resin compositions according to Comparative Examples 1 to 3. Furthermore, referring to Reference Example 1, a weight average molecular weight of the matting agent had a great effect on color migration characteristics.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A photosensitive resin composition, comprising:

(A) a colorant including a xanthene-based dye and a blue pigment having an average particle diameter (D50) of less than 100 nm;

(B) a binder resin including a radically polymerizable double bond;

(C) a photopolymerizable compound;

(D) a photopolymerization initiator;

(E) a matting agent represented by Chemical Formula 1; and (F) a solvent:

[Chemical Formula 1]

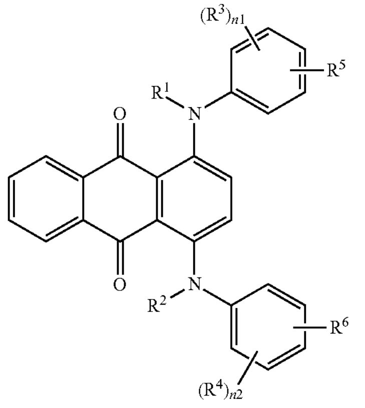

wherein, in Chemical Formula 1, $R^1$ to $R^4$ are each independently a hydrogen atom, a substituted or unsubstituted C1 to C20 alkyl group or a substituted or unsubstituted C6 to C20 aryl group, $R^5$ and $R^6$ are each independently a hydrogen atom, a substituted or unsubstituted C1 to C20 alkyl group, or a substituted or unsubstituted sulfonamide group, provided that at least one of $R^5$ and $R^6$ is a substituted or unsubstituted sulfonamide group, and n1 and n2 are each independently an integer of 1 to 3, wherein, the xanthene-based dye is represented by Chemical Formula 3:

[Chemical Formula 3]

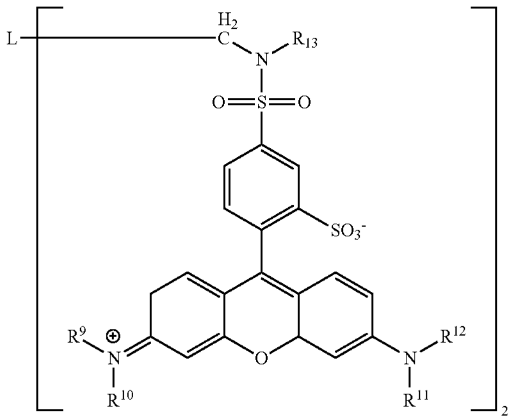

wherein, in Chemical Formula 3, $R^9$ to $R^{13}$ are each independently a hydrogen atom, a substituted or unsubstituted C1 to C20 alkyl group or a substituted or unsubstituted C6 to C20 aryl group, and L is a divalent linking group containing at least one aromatic ring.

2. The photosensitive resin composition of claim 1, wherein the substituted or unsubstituted sulfoneamide group is represented by Chemical Formula 2:

[Chemical Formula 2]

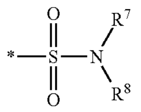

wherein, in Chemical Formula 2, $R^7$ and $R^8$ are each independently a hydrogen atom, a substituted or unsubstituted C1 to C20 alkyl group, a substituted or unsubstituted C3 to C20 cycloalkyl group, or a substituted or unsubstituted C6 to C20 aryl group.

3. The photosensitive resin composition of claim 1, wherein the matting agent represented by Chemical Formula 1 has a symmetric structure.

4. The photosensitive resin composition of claim 1, wherein the matting agent represented by Chemical Formula 1 has a weight average molecular weight of greater than or equal to 540 g/mol.

5. The photosensitive resin composition of claim 1, wherein in Chemical Formula 3, L is a substituted or unsubstituted C6 to C20 arylene group.

6. The photosensitive resin composition of claim 1, wherein the xanthene-based dye is included in an amount that is less than an amount of the blue pigment.

7. The photosensitive resin composition of claim 1, wherein the blue pigment is included in the photosensitive resin composition in the form of a dispersion, the dispersion further includes a dispersion resin, and the dispersion resin has a weight average molecular weight of 5,000 g/mol to 10,000 g/mol, and an acid value of 80 KOHmg/g to 150 KOHmg/g.

8. The photosensitive resin composition of claim 1, wherein the binder resin includes a structural unit represented by Chemical Formula 4-1:

[Chemical Formula 4-1]

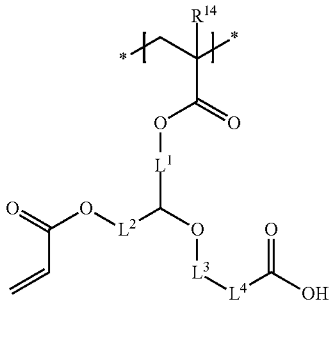

wherein, in Chemical Formula 4-1, $R^{14}$ is a hydrogen atom or a substituted or unsubstituted C1 to C20 alkyl group, $L^1$ to $L^3$ are each independently a single bond or a substituted or unsubstituted C1 to C20 alkylene group, and $L^4$ is a divalent linking group including a carbon-carbon double bond.

9. The photosensitive resin composition of claim 8, wherein the binder resin further comprises a structural unit represented by Chemical Formula 4-2, a structural unit represented by Chemical Formula 4-3, or a combination thereof:

[Chemical Formula 4-2]

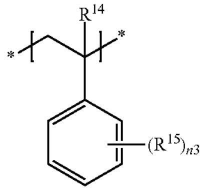

[Chemical Formula 4-3]

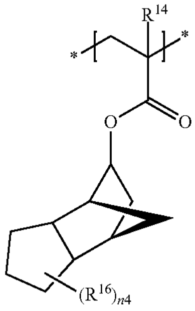

wherein, in Chemical Formula 4-2 and Chemical Formula 4-3, $R^{14}$ is a hydrogen atom or a substituted or unsubstituted C1 to C20 alkyl group, $R^{15}$ and $R^{16}$ are each independently a substituted or unsubstituted C1 to C20 alkyl group or a substituted or unsubstituted C6 to C20 aryl group, n3 is an integer of 0 to 5, and n4 is an integer of 0 to 3.

10. The photosensitive resin composition of claim 1, wherein the binder resin has a double bond equivalent of 300 g/mol to 700 g/mol.

11. The photosensitive resin composition of claim 1, wherein the binder resin has a weight average molecular weight of 5,000 g/mol to 20,000 g/mol.

12. The photosensitive resin composition of claim 1, wherein the binder resin has an acid value of 20 KOHmg/g to 90 KOHmg/g.

13. The photosensitive resin composition of claim 1, wherein the photosensitive resin composition includes:

20 wt % to 40 wt % of the (A) colorant;

0.5 wt % to 20 wt % of the (B) binder resin;

1 wt % to 20 wt % of the (C) photopolymerizable compound;

0.1 wt % to 5 wt % of the (D) photopolymerization initiator;

0.01 wt % to 1 wt % of the (E) matting agent; and a balance amount of the (F) solvent, all wt % being based on a total weight of the photosensitive resin composition.

14. The photosensitive resin composition of claim 1, comprising at least one additive selected from malonic acid; 3-amino-1,2-propanediol; a coupling agent containing a vinyl group or a (meth)acryloxy group; a leveling agent; and a fluorine-based surfactant.

15. A photosensitive resin layer manufactured using the photosensitive resin composition of claim 1.

16. A color filter comprising the photosensitive resin layer of claim 15.

* * * * *